United States Patent [19]

Kocis et al.

[11] Patent Number: 5,245,231
[45] Date of Patent: Sep. 14, 1993

[54] INTEGRATED DELAY LINE

[75] Inventors: Thomas J. Kocis; Darius D. Gaskins, both of Austin, Tex.

[73] Assignee: Dell USA, L.P., Austin, Tex.

[21] Appl. No.: 816,313

[22] Filed: Dec. 30, 1991

[51] Int. Cl.$^5$ .............................................. H03K 5/13
[52] U.S. Cl. ...................................... 307/606; 307/602; 307/269; 328/63
[58] Field of Search ............... 307/601, 602, 606, 592, 307/593, 595, 596, 527, 525, 518, 269; 328/63

[56] References Cited

U.S. PATENT DOCUMENTS

| | | | |
|---|---|---|---|
| 3,588,707 | 6/1971 | Manship | 328/55 |
| 4,675,612 | 6/1987 | Adams et al. | 328/55 |
| 4,713,621 | 12/1987 | Nakamura et al. | 328/55 |
| 4,845,390 | 7/1989 | Chan | 307/595 |
| 4,868,514 | 9/1989 | Azevedo et al. | 307/525 |
| 5,087,842 | 2/1992 | Pulsipher et al. | 328/55 |

Primary Examiner—Jin F. Ng
Assistant Examiner—Sinh Tran
Attorney, Agent, or Firm—Thomas G. Devine; James W. Huffman

[57] ABSTRACT

A delay line within an integrated circuit and calibrated by an external time period (calibration clock). The speed of devices in the integrated circuit is assessed using the calibration clock, and this speed then controls how many delay cells within the delay line an input must traverse to trigger the delayed output.

14 Claims, 7 Drawing Sheets

INTEGRATED DELAY LINE

PARTIAL WAIVER OF COPYRIGHT PURSUANT TO 1077 O.G. 22 Mar. 20, 1987

All of the material in this patent application is subject to copyright protection under the copyright laws of the United States and of other countries. As of the first effective filing date of the present application, this material is protected as unpublished material.

Portions of the material in the specification and drawings of this patent application are also subject to protection under the maskwork registration laws of the United States and of other countries.

However, permission to copy this material is hereby granted to the extent that the owner of the copyright and maskwork rights has no objection to the facsimile reproduction by anyone of the patent document or patent disclosure, as it appears in the United States Patent and Trademark Office patent file or records, but otherwise reserves all copyright and maskwork rights whatsoever.

BACKGROUND AND SUMMARY OF THE INVENTION

The present invention relates to electronic devices, and, more particularly, to integrated circuits including component delay lines and methods of delay generation.

Clocked digital systems often need multiple clock phases for fine timing control, and such phases can be flexibly generated by use of delay lines to simply defining clock phases as delayed versions of the system clock. Similarly, analog systems can use tapped delay lines for performing discrete convolutions and similar operations. Indeed, a simple ring oscillator made of an inverter with a delay line feedback will have a frequency equal to the inverse of the delay.

Circuitry requiring a delay line will often be connected to an external delay line: monolithic multitap delay lines with programmable delays are available. For example, the DS1020 manufactured by Dallas Semiconductor Corporation provides programmable delays from 10 nsec to over 500 nsec. However, for circuitry that is integrated into a single chip, the use of external delay lines becomes unreliable, expensive, requires chip pins for connection, and the delay accuracy does not scale. Thus there is a need for an accuracy-scalable delay line that may be fabricated as part of a digital integrated circuit.

Further, semiconductor device speed depends upon various factors, and not uncommonly there is a speed variation of four-to-one for supposedly identically manufactured integrated circuits operating under differing conditions. External delays lines cannot fully compensate for such variations, and there is a need for operating condition compensation within delay lines.

An alternative to delay lines for granularizing a digital system's clock is the use of a phase locked loop to multiply the clock frequency. A phase locked loop can be formed as part of an integrated circuit, but has the problems of cumbersome integration due to the voltage controlled oscillator and a lock-in time for any nontrivial frequency change. Additionally, most digital integrated circuits offerings, such as standard cells and gate arrays, do not offer voltage controlled oscillator building blocks.

The present invention provides embodiments with a speed calibration for a circuit using delay elements and then applies the calibration to control other delay lines made of analogous delay elements to provide device-speed independent delays.

BRIEF DESCRIPTION OF THE DRAWING

The present invention will be described with reference to the accompanying drawings, which show important sample embodiments of the invention, which are schematic for clarity, and which are incorporated in the specification hereof by reference, wherein.

DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Figure 1:
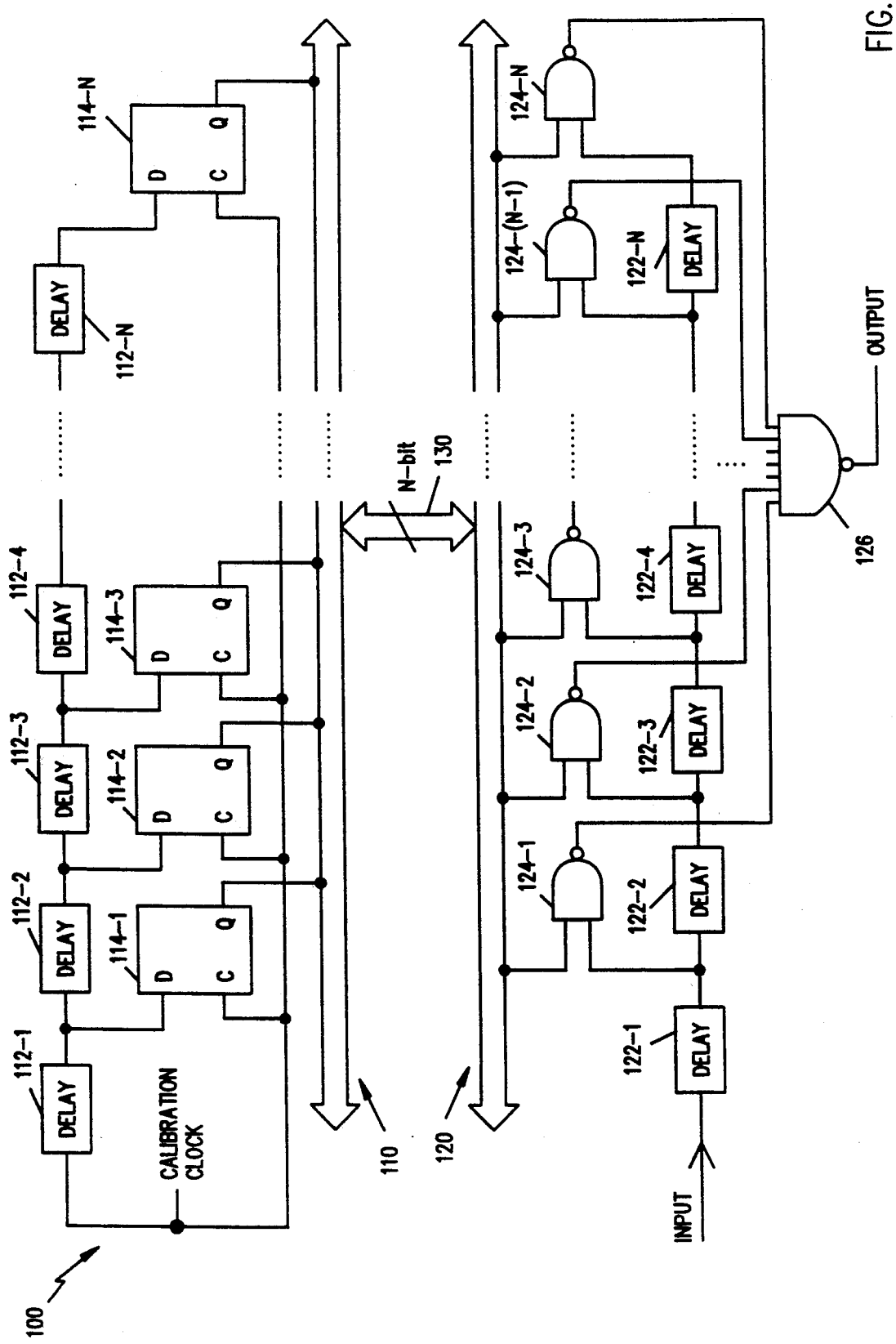
FIG. 1 is a functional/structural block circuit diagram of a first preferred embodiment delay line.

FIG. 1 is a simplified schematic circuit diagram of a first preferred embodiment integrated delay line, generally denoted by reference numeral 100, which includes calibration circuit 110 and calibrated delay line 120. Delay line 100 provides a digital output at terminal OUTPUT that is a delayed version of a digital input at terminal INPUT; the delay should be independent of operating conditions. Calibration circuit 110 includes $N+1$ identical serially-connected digital delay cells, labelled 112-1, 112-2, ... 112-N, and N identical D flip-flops, labelled 114-1, 114-2, ... 114-N. Calibrated delay line 120 includes N identical serially-connected digital delay cells, labelled 122-1, 122-2, ... 122-N, and N NAND gates 124-1, 124-2, ... 124-N which feed N-input NAND gate 126. The delay cells 122-j typically differ from the delay cells 112-j, although they could be the same. Delay cells 112 and 122-j can be made of inverter chains or other standard digital devices, as considered below. N-bit bus 130 connects the Q outputs of the N flip-flops to the N NAND gates so that the output of flip-flop 114-1 goes to NAND gate 124-1, the output of flip-flop 114-2 goes to NAND gate 124-2, and so forth. To consider the operation of delay line 100, presume that it is part of an integrated circuit which has a calibration clock of period 5T seconds (frequency 1/5T Hz) and duty cycle of 4/5 and that it is to provide a delay of $\lambda T$ from INPUT to OUTPUT where $\lambda$ is a number greater than 0. That is, the calibration clock is low for a time interval T and then high for a time interval 4T. This calibration clock can be generated by a sequential logic circuit which is clocked by a clock of frequency 1/T Hz. Delay line 100 then operates as follows.

Each delay cell 112-j provides a delay t where t can vary from a minimum $t_{min}$ to a maximum $t_{max}$; this variance of t reflects differing operating conditions, such as temperature and power supply voltage levels, and different fabrication processing. The ratio of $t_{max}$ to $t_{min}$ may be about four to one. N is chosen to be about $T/t_{min}$; that is, when the devices of the integrated circuit containing delay line 100 are running at their peak speed (minimal propagation delays), then a high-to-low transition of the calibration clock propagates through and fills up the string of delay cells 112-1, 112-2, ... 112-(N−1) in time interval T. When the devices are running slower (each cell providing a delay of t), the high-to-low will propagate through $Nt_{min}/t$ of the cells in one time interval T. Thus a high-to-low will always propagate through at least $Nt_{min}/t_{max}$ cells; that is, about a quarter of the cells. Conversely, a low-to-high transition of the calibration clock will propagate through and fill up all of delay cells 112-1, ... 112-N in time interval 4T even when the devices are running at their slowest because $4T/t_{max}=4Nt_{min}/t_{max}=N$. Numerical values may be as follows. T is 50 nanoseconds (nsec) for a calibration clock frequency of 4 MHz (or a higher frequency calibration clock divided down to 4 MHz); N is 10; $t_{min}$ is 5 nsec; and $t_{max}$ is 20 nsec. The greater N and the smaller $t_{min}$ and $t_{max}$, the finer the control.

The number of flip-flops 114-j with a low input when clocked by a low-to-high transition of the calibration clock measures the running speed of the integrated circuit devices. This number appears on bus 130 and is updated by simply propagating the calibration clock through the delay cells 112-j. In particular, have a first low-to-high transition of the calibration clock which propagates through all of the delay cells 112-1, ... 112-N during the 4T time interval that the calibration clock is high even if the devices are running at their slowest speed. Next, the high-to-low transition of the calibration clock propagates through cells 112-1, 112-2, ... with each cell providing a delay of t. Hence, the high-to-low transition will have passed through cells 112-1, 112-2, ... 112-(k−1) but not 112-k, ... 112-N for k=$Nt_{min}/t$ after time interval T when the calibration clock again makes a low-to-high transition and clocks flip-flops 114-j. Thus flip-flops 114-1, 114-2, ... 114-N load the data at their D inputs which will be low for flip-flops 114-1, 114-2, ... 114-(k−1) and high for the rest. So bus 130 will contain the N-bit calibration word 00..01..11 with k−1 0s and N−k+1 1s. And the Q outputs of flip-flops 114-1, 114-2, ..., 114-N will hold this N-bit word on bus 130 until a calibration update occurs (the next rising edge of the calibration clock). If the device's operating conditions have changed little the calibration word should remain the same, or at most change in one bit. If more than one bit changes, the sampling of the calibration word must be hastened to the point at which this is no longer true. If the Q outputs of flip-flops 114-j are subject to metastability, where the outputs are non-deterministic because of setup violations, the calibration word can be re-synchronized with a second tier of flip-flops also clocked by the calibration clock. A third level of synchronization may also be required which is clocked synchronously with INPUT. Its purpose would be to prevent glitches in the OUTPUT due to changes in the calibration word.

Calibrated delay line 120 provides the delay of λT from INPUT to OUTPUT as follows. Delay cells 122-1, 122-2, ... 122-N are designed to each provide a delay of λt with a minimum of $\lambda t_{min}$ and a maximum of $\lambda t_{max}$; that is, the cells 122-j may just be a scaled version of the cells 112-j. Again, the variation in delay time reflects the operating conditions, and because the devices of calibrated delay line 120 are part of the same integrated circuit as those of calibration circuit 110, λt will vary in strong correlation with t. A low-to-high transition at the INPUT terminal to cell 122-1 will propagate through cells 122-1, 122-2, ... , and as it emerges from cell 122-j it will change one of the inputs to the corresponding NAND gate 124-j. Now the N-bit word on bus 130 controls calibrated delay line 120 by providing one low input to each of NAND gates 124-1, 124-2, ... 124-(k−1) and one high input to each of NAND gates 124-k, ... 124-N. Thus when the low-to-high transition applied at INPUT emerges from cell 122-j with j less than k, the NAND gates 124-1, 124-2, ... 124-j have at least one low input from bus 130 and are high, and the NAND gates 124-(j+1), ... 124-N have one low input from cells 122-(j+1), ... 122-N and thus also are high. This implies NAND gate 126 has all high inputs and holds OUTPUT low. However, when the low-to-high transition emerges from cell 122-k, NAND gate 124-k has two high inputs and goes low. This drives NAND gate 126 and OUTPUT high. The time delay between the low-to-high at INPUT and this low-to-high at OUTPUT equals kλt because the low-to-high must propagate through k cells to reach NAND gate 124-k (which has its other input high from 130) and drive the NAND gate low. Now k=$Nt_{min}/t$ and N=$T/t_{min}$; so kλt=λT and hence the delay from INPUT to OUTPUT does not depend upon t. This means that the delay from INPUT to OUTPUT is independent of the operating conditions. The high at OUTPUT persists as the low-to-high propagates through cells 122-(k+1), ... 122-N, and also thereafter as any trailing highs following the low-to-high propagate. That is, the waveform at OUTPUT stays high longer than the waveform input at INPUT, but the delay from the rising edge at INPUT to the rising edge at OUTPUT is constant.

Figure 2:
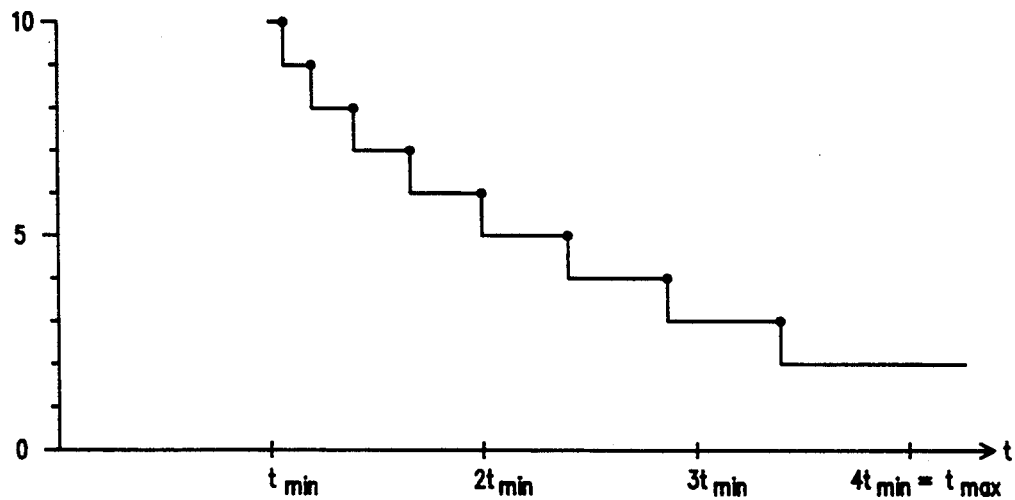
FIGS. 2-3 show the calibration and delay in the first preferred embodiment.

The foregoing analysis ignored the fact that N and k are integers, so roundoff errors arise to limit the accuracy of the delay. Of course, a larger N and smaller $t_{min}$ imply a smaller roundoff error. FIG. 2 indicates the number of 0s on bus 130 as a function of t presuming N is 10, and FIG. 3 roughly shows the actual INPUT to OUTPUT delay presuming further that λ is 0.5. Further, there may be variations between delay elements which will also reduce the accuracy, but the correlation will be strong enough to make this a useful technique in many applications.

Delay cells 112-j and 122-j may be made of inverter chains or other standard digital circuits and use their inherent propagation delays because the delays desired are typically fairly short: from 1 to 50 nsec. Standard delay circuits such as current sources charging up capacitors may be useful for longer delays; the current sources would be sized and be the devices that vary with operating conditions, no voltage references need be used. The use of inverter chains provides a simple approach. Typical CMOS processes with submicron gate lengths will have inverter delays on the order of less than 1 nsec for a fanout of one, so a cell 112-j could be a chain of ten inverters. An inverter chain allows for simple cells 122-j for $\lambda = 0.2, 0.4, 0.6,$ or $0.8$ by just using two, four, six, or eight-inverter long chains without any need for different size FETs in the inverters. Furthermore, if the Q# outputs of alternate flip-flops 114-1, 114-3, ... were used, then cells 122-1, 122-2, ... could use an odd number of inverters and provide for $\lambda = 0.1, 0.3, 0.5, 0.7,$ and $0.9$ in the same simple manner.

Because a failing edge of the calibration clock always propagates through cells 112-1, ... 112-j for $j = N/4$ even when the cells are providing the maximum $t_{max}$ delay, the flip-flops 114-1, 114-2, ... 114-(N/4) are not needed, the corresponding bus 130 lines are not needed, and the NAND gates 124-1, 124-2, 124-(N/4) are not needed. This reduces the actual number of devices and bus lines required by delay line 100. Further, calibration line 110 only uses a single low going pulse of a known duration (T) from the calibration clock to generate the calibration word, so different calibration clock duty cycles and periods could be used. However, all consequences should be considered.

Figure 4:
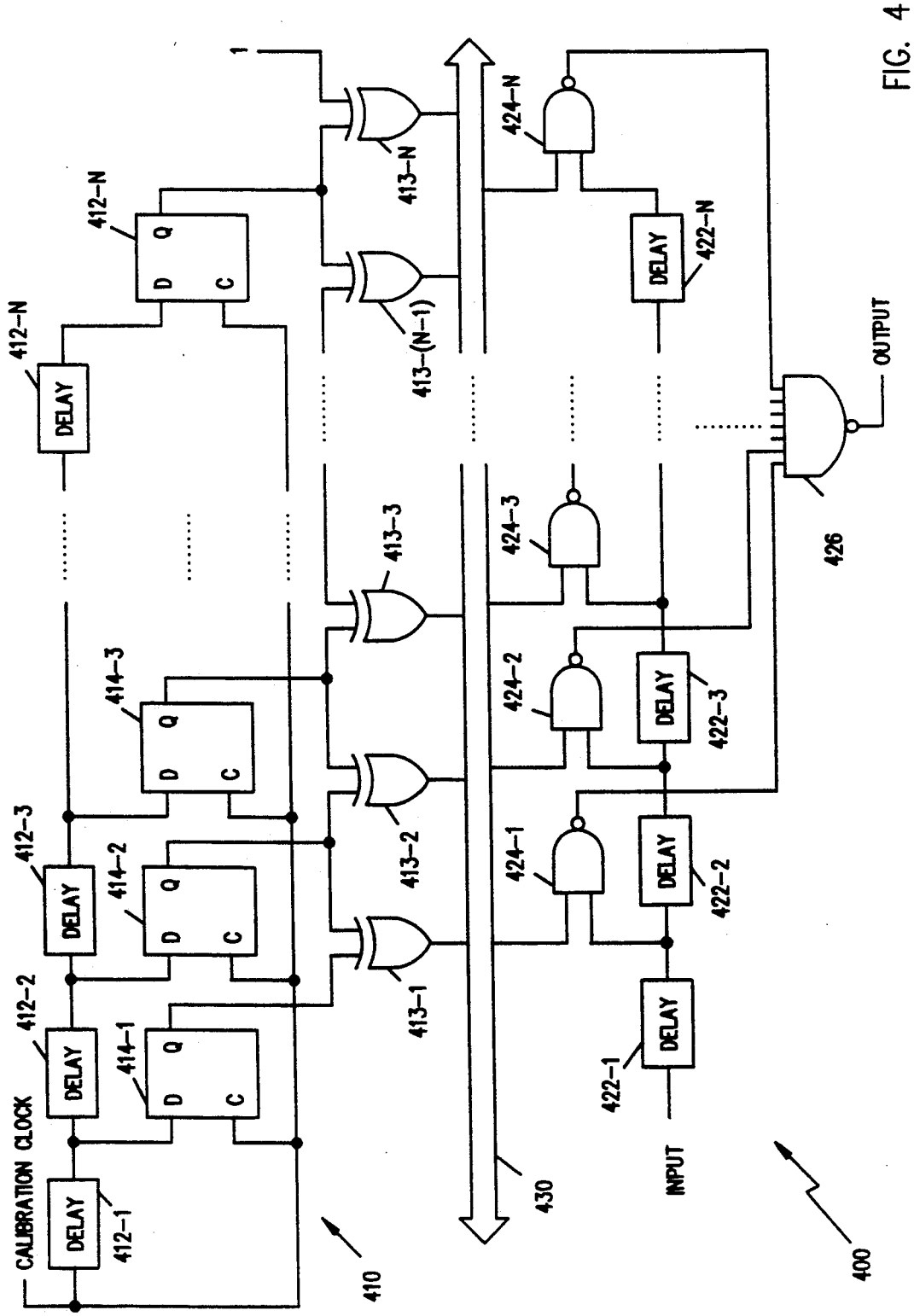
FIG. 4 shows a second preferred embodiment.

FIG. 4 illustrates a second preferred embodiment delay line 400 which uses edge detection by exclusive OR (XOR) gates in the calibration circuit 410 to generate a calibration word with a single 1 and rest 0s on bus 430. Thus if the high-to-low transition of the calibration clock propagates through exactly k of delay cells 412-j in one time interval T (at which time the low-to-high transition clocks the flip-flops 414-j), then only XOR gate 413-k will have one high and one low input and thus have a high output. Thus the calibration word is 00...010..00 with the 1 at the kth bit. Again, the initial quarter of the XOR gates and flip-flops should be eliminated because they provide to information on the low-to-high, and if the duty cycle of the calibration clock is not large enough, a high-to-low will propagate far enough to provide a second one of the XOR gates with complementary inputs to thus another 1 bit in the calibration word.

In delay line 400 after a low-to-high at INPUT has propagated through k of delay cells 422-j it will input a high to NAND gate 424-k which will then switch low due to the high kth bit on bus 430. This drives output NAND gate 426 and OUTPUT high. Again, if the delay of each cell 412-j is a variable t, and if the delay of each cell 422-j is $k\lambda t$, then the delay from INPUT to OUTPUT is $\lambda T$ and does not depend upon t which means that it is independent of the operating conditions. The high at OUTPUT persists as trailing highs following the low-to-high propagate through delay cell 422-k so that the waveform at OUTPUT replicates the waveform at INPUT delayed by $\lambda T$.

Figure 5:
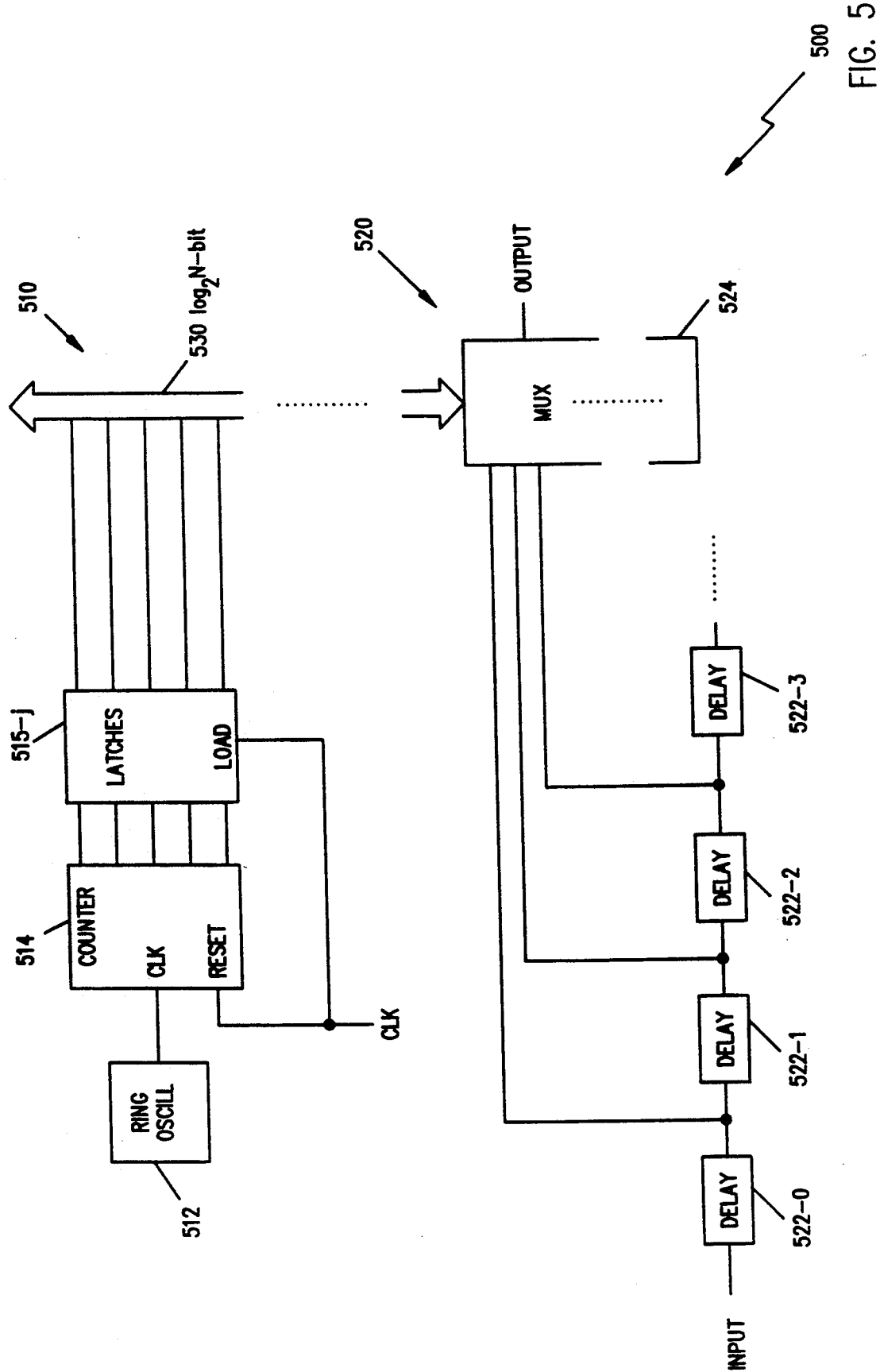
FIG. 5 is a functional/structural block circuit diagram of a third preferred embodiment delay line.

FIG. 5 shows a third preferred embodiment delay line 500 which includes calibration circuit 510 and calibrated delay line 520 with calibration word bus 530. Calibration circuit 510 which essentially uses ring oscillator 512 in place of the delay cells 112-j and counter 514 plus latches 515-j in place of flip-flops 114-j. Ring oscillator 512 is made of devices which will run faster when the delay cells of calibrated delay lines 120 run faster in order to provide the calibration word; indeed, ring oscillator 512 could be made with a chain of inverting delay cells. Calibration circuit 510 operates as follows. Ring oscillator continually runs and outputs pulses with period t where t varies between a minimum of $t_{min}$ and a maximum of $t_{max}$ depending upon operating conditions (the same as in calibration circuit 110). Ring oscillator drives the clock input of $\log_2 N$-bit binary counter 514 where N is $T/t_{min}$ with T the period of a calibration clock. The calibration clock rising edge loads the $\log_2 N$ latches 515-j with the output of counter 514 just prior to resetting counter 514. Then counter 514 counts up to $k = Nt_{min}/t$ during one calibration clock period T, and binary-coded k loads into latches 515-j at the start of the next calibration clock period. The latches 515-j put the binary-coded k onto bus 530 which controls the calibrated delay line 520. Multiplexer 524 takes the place of NAND gates 124-j and NAND gate 126 to determine when a transition input at INPUT emerges from the kth delay cell 522-(k−1) and then drives OUTPUT high. Delay line 500 differs from delay line 100 in that the calibration word is encoded and decoded in delay line 500 but not in delay line 100. For large N, the encoding of the calibration word permits fewer bus lines (for N = 16 bus 130 should have 12 lines even when the bottom quarter are removed and bus 530 will have only 4 lines) which may be significant if many calibrated delay lines are to be driven at various locations in the integrated circuit. This circuit delays both rising and falling edges of the input signal to create the output. Of course, delay line 100 could include encoders and decoders for its bus 130 without using a ring oscillator or counter.

Figure 6:
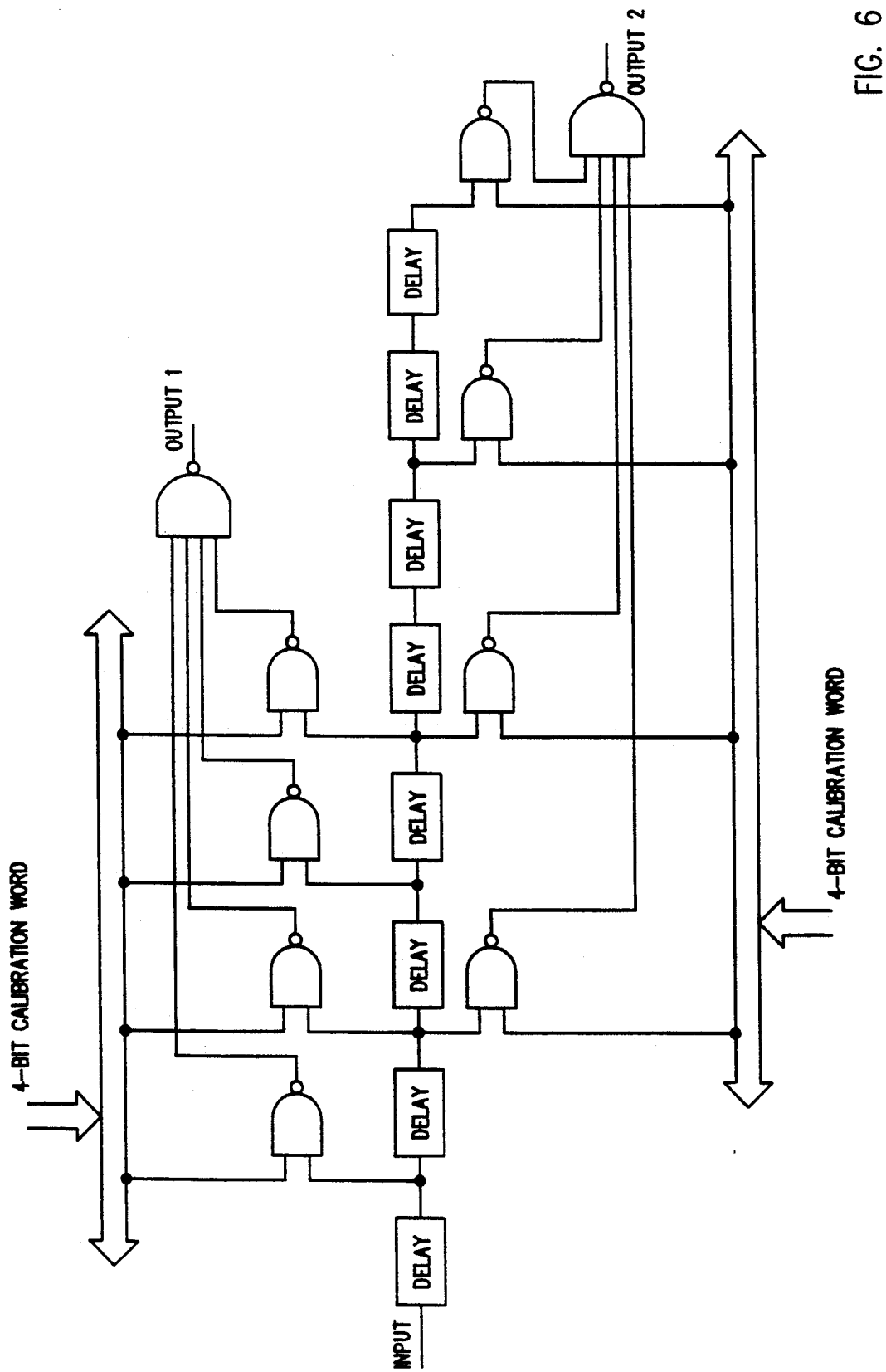
FIG. 6 illustrates a variation of the first preferred embodiment.

A tapped delay line can be made from delay line 100 if the delay cells 122-j include multiple devices. In effect, two delay lines may overlap. FIG. 6 illustrates a simplified tapped calibrated delay line which can easily be extended to further delay cells, further taps, and may be easily implemented with inverter chains for the delay cells.

Figure 7:
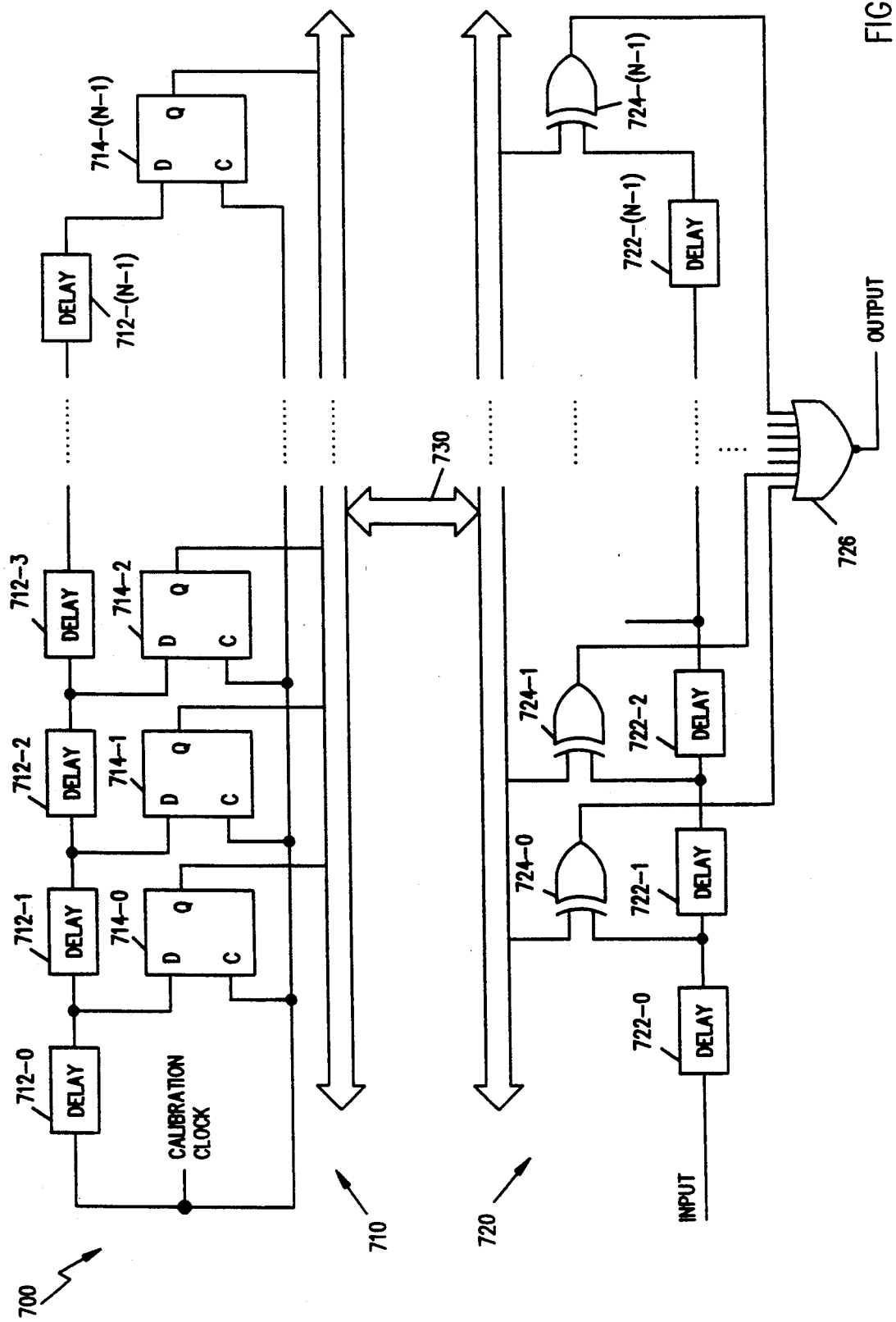
FIG. 7 shows a fourth preferred embodiment.

FIG. 7 is a simplified schematic circuit diagram of a fourth preferred embodiment integrated delay line, generally denoted by reference numeral 700, which includes calibration circuit 710 and calibrated delay line 720. Calibration circuit 710 includes N identical serially-connected digital delay cells, labelled 712-0, 712-1, ... 712-(N−1), and N identical D flip-flops, labelled 714-0, 714-1, ... 714-(N−1). Calibrated delay line 720 includes N identical digital delay cells, labelled 722-0, 722-1, ... 722-(N−1), and N exclusive OR (XOR) gates 724-0, 724-1, ... 724-(N−1) which feed N-input NOR gate 726. The delay cells 722-j typically differ from the delay cells 712-j, although they could be the same. Delay cells 712-j and 722 can be made of inverter chains or other standard digital devices, as considered below. N-bit bus 730 connects the outputs of the N flip-flops to the N XOR gates so that the output of flip-flop 714-0 goes to XOR gate 724-0, the output Of flip-flop 714-1 goes to XOR gate 724-1, and so forth. To consider the operation of delay line 700, presume that it is part of an integrated circuit which has a calibration clock of period 5T seconds (frequency 1/5T Hz) with duty cycle 4/5 and that it is to provide a delay of $\lambda T$ from INPUT to OUTPUT where $\lambda$ is a number greater than 0. Delay line 700 then operates as follows.

Each delay cell 712-j provides a delay t where t can vary from a minimum $t_{min}$ to a maximum $t_{max}$; as before, this variance of t reflects differing operating conditions, such as temperature and power supply voltage levels. The ratio of $t_{max}$ to $t_{min}$ may be about four to one. N is chosen to be about $T/t_{min}$; that is, when the devices of the integrated circuit containing delay line 700 are running at their peak speed (minimal propagation delays), then a signal propagates through the string of delay cells 712-0, 712-1, ... 712-(N−1) in just one time interval T. For the devices running slower (each cell providing a delay of t), a signal will propagate through $Nt_{min}/t$ of the cells in one time interval T. Thus a signal will always propagate through at least $Nt_{min}/t_{max}$ cells; that is, about a quarter of the cells. Typical numerical values may be as follows. T is 50 nanoseconds (nsec) for a calibration clock frequency of 4 MHz; N is 10; $t_{min}$ is 5 nsec; and $t_{max}$ is 20 nsec. The greater N and the smaller $t_{min}$ and $t_{max}$, the finer the control.

The number of delay cells 712-j a signal propagates through in one time interval T measures the running speed of the integrated circuit devices. This number appears on bus 730 and is updated by simply propagating the calibration clock through the delay cells 712-j. In particular, have a first falling edge of the calibration clock enter cell 712-0. This transition from high to low then propagates through cells 712-0, 712-1, ... with each cell providing a delay of t. Hence, the high to low transition will have passed through cells 712-0, 712-1, ... 712-(k−1) but not 712-k, ... 712-(N−1) for $k=Nt_{min}/t$ when the calibration clock rises. Then at the next rising edge of the calibration clock drive all of flip-flops 714-0, 714-1, ... 714-(N−1) to load the data at their D inputs which will be low for flip-flops 714-0, 714-1, ... 714-(k−1) and high for the rest. So bus 730 will contain the N-bit calibration word 00..01..11 with k 0s and N-k 1s. And flip-flops 712-0, 712-1 ..., ... 712-(N−1) will hold this N-bit word on bus 730 until a calibration update changes the output of one or more of the flip-flops, in which case one or more bits of the N-bit word on bus 130 will switch.

Calibrated delay line 720 provides the delay of $\lambda T$ from INPUT to OUTPUT as follows. Delay cells 722-0, 722-1, ... 722-(N−1) are designed to each provide a delay of $\lambda t$ with a minimum of $\lambda t_{min}$ and a maximum of $\lambda t_{max}$; that is, the cells 722-j may just be a scaled version of the cells 712-j. Again, the variation in delay time reflects the operating conditions, and because the devices of calibrated delay line 720 are part of the same integrated circuit as those of calibration circuit 710, $\lambda t$ will vary in the same manner as t. A high-to-low transition at the INPUT terminal to cell 722-0 will propagate through cells 722-0, 722-1, ..., and as it emerges from cell 722-j it will change one of the inputs to the corresponding XOR gate 724-j. Now the N-bit word on bus 730 controls calibrated delay line 720 by providing one low input to each of XOR gates 724-0, 724-1, ... 724-(k−1) and one high input to each of the XOR gates 724-k, ... 724-(N−1). Thus when the high-to-low transition applied at INPUT emerges from cell 722-j with j less than k−1, the XOR gates 724-0, 724-1, ... 724-j have two low inputs and are low, the XOR gates 724-(j+1), ... 724-(k−1) have one low input from bus 730 and one high input from cells 722-(j+1), 722-(k−1) and thus are high, and the XOR gates 724-k, ... 724-(N−1) have two high inputs and are low. This implies NOR gate 726 has at least one high input and holds OUTPUT low. However, when the high-to-low transition emerges from cell 722-(k−1), XOR gates 724-0, 724-1, ... 724-(k−1) each has two low inputs and XOR gates 724-k, ... 724-(N−1) each has two high inputs, so all XOR gates output a low to drive NOR gate 726 and OUTPUT high. The time delay between the high-to-low at INPUT and this low-to-high at OUTPUT equals $k\lambda t$ because the high-to-low must propagate through k cells to match the k 1s on bus 730 and drive all XOR gates low. Now $k=Nt_{min}/t$ and $N=T/t_{min}$; so $k\lambda t=\lambda T$ and the delay from INPUT to OUTPUT does not depend upon t which means that it is independent of the operating conditions.

The foregoing analysis again ignored the fact that N and k are integers, so roundoff errors arise to limit the accuracy of the delay. Of course, a larger N and smaller $t_{min}$ imply a smaller roundoff error.

The high at OUTPUT will drop to back low when the high-to-low emerges from delay cell 722-k, and thus some latch should be added at OUTPUT if more than a delayed low-to-high transition is desired. And a second parallel delay line with inverted cell outputs with a multi-input OR gate would be needed to also propagate the low-to-high transition.

When the signals applied to INPUT of delay line 700 are repetitive, the desired delays are large, And the devices are running slowly, then a first signal may still be propagating near the end of the delay line when a second signal enters the start of the delay line. The first signal may then disrupt the detection of the second signal.

Figure 8:
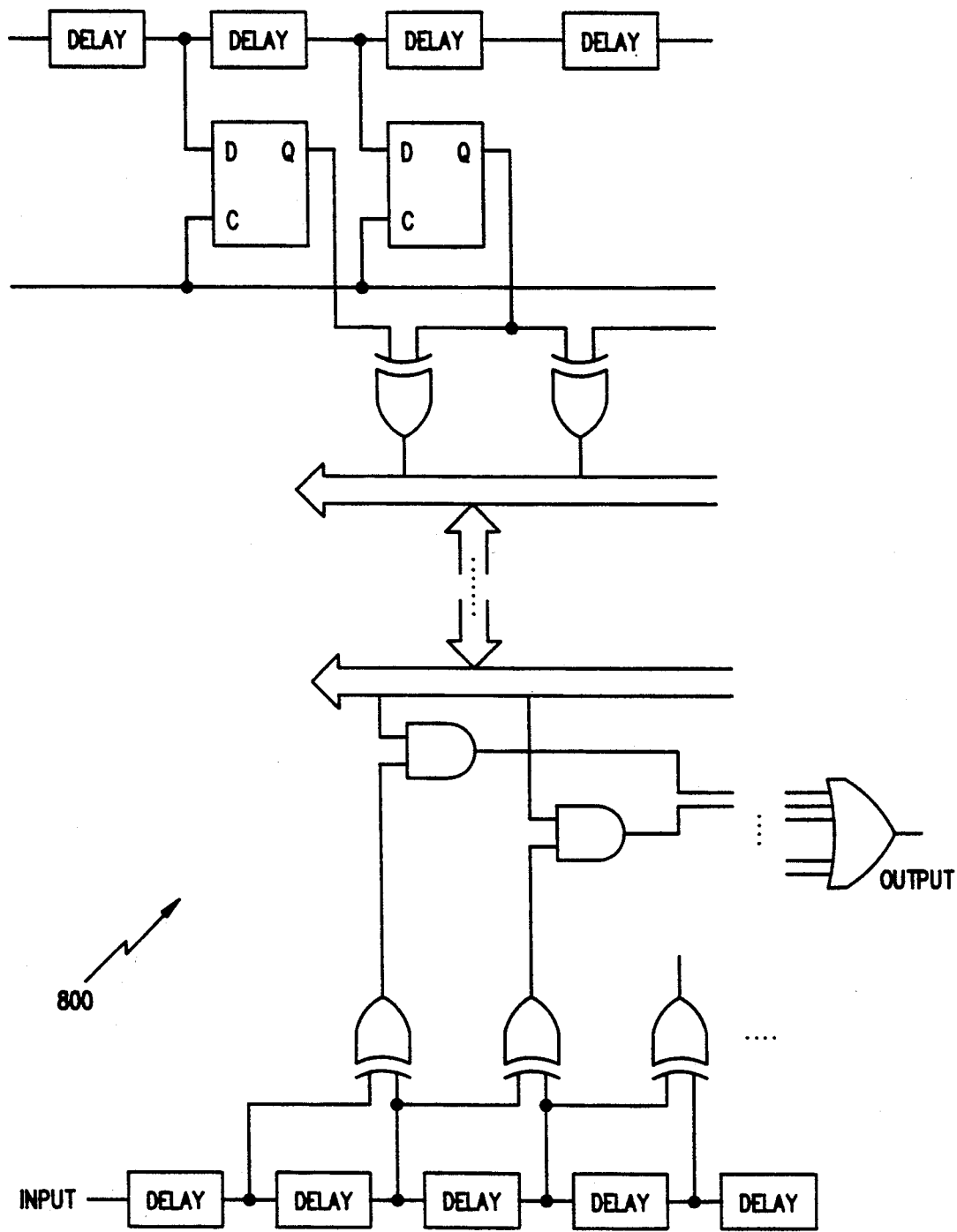
FIG. 8 illustrates a variation of the fourth preferred embodiment.

Delay line 800 illustrated in FIG. 8 overcomes the slow propagation problem of two transitions simultaneously on the delay line. Delay line 800 differs from delay line 700 in that the calibration word indicates a transition location and only a single matching transition in the delay line drives OUTPUT high. That is, earlier transitions still propagating through the delay line do not participate in the match criteria.

Further Modifications and Variations

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

Figure 3:
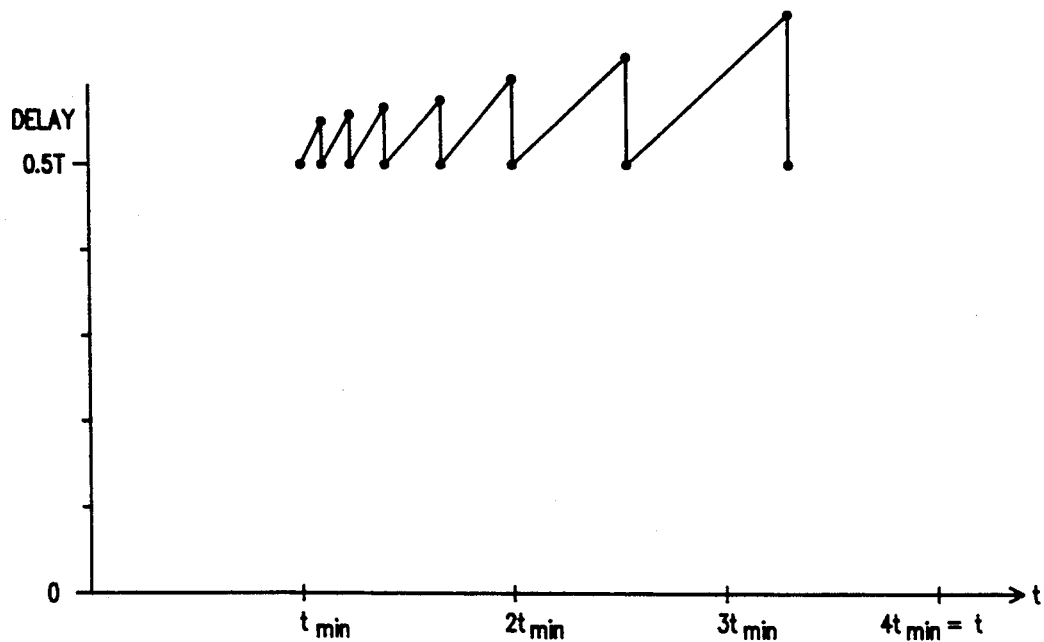

For example, the high time interval of the calibration clock could be used for the calibration line with the Q# outputs of flip-flops; the signals delayed could be high-to-low transitions by inverting the inputs to the NAND gates. Indeed, many combinatorial logic circuits could be used. Further, as illustrated in FIG. 3 when the devices are running close to their slowest speed and the delay cells are generating delays of up to $t_{max}$, then a one cell delay error has the largest percentage impact. Thus by using finer granularity in the cells determining the delay (those cells just past the first quarter of cells which signals always propagate through), the maximum error can be reduced. And this finer granularity can be achieved, for example, by replacing a cell with delay t by two cells each with a delay of t/2. More generally, the cells in the calibration line could have differing delays provided that the corresponding cells of the calibrated lines had proportional delays. Further, an extra cell could be inserted at the beginning of the calibration line in order to shift the granularity error illustrated in FIG. 3 from delays which are too long to delays which are too short, or even centering the granularity error about the desired delay.

Furthermore, the calibration clock could be replaced by a one-shot with a stable and operating-condition-independent low going pulse of duration T. Of course, varying the calibration clock time interval T allows for external adjustment of the delay.

When the ratio of the maximum delay to the minimum delay (ratio of $t_{max}$ to $t_{min}$) differs from the four to one of the preferred embodiments, then various aspects such as the insignificance of the first one quarter of flip-flops would have a corresponding change.

Synchronization techniques described in connection with delay line 100 may be applied to any of the other preferred embodiments.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. A delay line, comprising:
   (a) a calibration sequence of N delay cells, $C_1, C_2 \ldots C_N$;
   (b) a second sequence of N delay cells, $S_1, S_2 \ldots S_N$, with the delay of each of said cells of said second sequence equal to about $\lambda$ times the delay of the corresponding cell of said calibration sequence, where $\lambda$ is any number greater than zero;
   (c) a sequence of N latches, $L_1, L_2 \ldots L_N$, wherein each of said latches $L_j$ has inputs coupled to outputs of $C_j$ for some j; and
   (d) logic circuitry with inputs both from said sequence of N latches and from outputs of N delay cells of said sequence and with an output indicating when said outputs of N delay cells of said second sequence correlate to said outputs of N delay cells of said calibration sequence.

2. The delay line of claim 1, wherein:
   (a) said N delays cells of both said calibration sequence and said second sequence consist essentially of inverters.

3. A delay line comprising:
   (a) a calibration sequence of delay cells;
   (b) a second sequence of delay cells with the delay of each of said cells of said second sequence equal to about $\lambda$ times the delay of the corresponding cell of said calibration sequence, where $\lambda$ is any number greater than zero;
   (c) latch circuitry which stores information of the outputs of a plurality of cells of said calibration sequence;
   (d) a plurality of two-input NAND gates feeding a multi-input NAND gate, each of said two-input NAND gates with one input from a latch storing the output of a cell of said calibration sequence and the other input from a corresponding cell in said second sequence;
   (e) whereby an input low-to-high transition propagating through the cells of said second sequence will generate a low-to-high transition in said multi-input NAND gate when said input transition reaches the first of said two-input NAND gates with a high input from its corresponding latch.

4. The delay line of claim 3, wherein:
   (a) said calibration sequence includes N cells, $C_1, C_2 \ldots C_N$;
   (b) said second sequence includes N cells, $S_1, S_2, \ldots S_N$;
   (c) each of said two-input NAND gates has inputs derived from a pair $C_j$ and $S_j$ for some j.

5. The delay line of claim 4, wherein:
   (a) each of said cells $C_j$ provides a delay of t nanoseconds; and
   (b) each of said cells $S_j$ provides a delay of $\lambda t$ nanoseconds;
   (c) whereby if a high-to-low transition propagates for a time T nanoseconds (independent of the value of t) through said calibration sequence and then the cell outputs are latched, with k equal to the integral part of T/t, the latched output of said cell $C_{k-1}$ will be low and the latched output of cell $C_k$ will be high, and the two-input NAND gate with inputs derived from cells $C_k$ and $S_k$ will first have two high inputs when a low-to-high transition propagates through cells $S_l, \ldots S_k$ which will take a time about equal to $\lambda T$ independent of t.

6. The delay line of claim 5, wherein:
   (a) said t is in the range of $t_{min}$ to $t_{max}$; and
   (b) said N is an integral approximation of $T/t_{min}$.

7. The delay line of claim 6, wherein:
   (a) said plurality of said calibration cells is contained in the set of cells $C_i, C_{i+1}, \ldots C_N$ where i equals the integral part of $T/t_{max}$.

8. An integrated circuit including a delay line, comprising:
   (a) a calibration circuit;
   (b) a sequence of N delay cells, $S_1, S_2 \ldots S_N$, wherein outputs of said delay cells $S_1 \ldots S_{N-1}$ are connected to inputs of said delay cells $S_2 \ldots S_N$, respectively; and
   (c) circuitry connected to outputs of said delay cells $S_1, S_2 \ldots S_N$ and to said calibration circuit, said circuitry indicating when a signal propagating through said sequence has passed through k of said cells (k less than or equal to N) where said calibration circuit determines k.

9. The delay line of claim 8, wherein:
   (a) said calibration circuit includes a ring oscillator and counter; and
   (b) said circuitry includes a multiplexer.

10. The delay line of claim 8, wherein:
    (a) said calibration circuit includes a calibration sequence of delay cells; and
    (b) an input for an external fixed time duration pulse;
    (c) whereby said k is determined by how many of said delay cells of said calibration sequence said pulse simultaneously traverses.

11. The delay line of claim 8, further comprising:
    (a) said sequence of N delay cells connected to second circuitry to thereby allow said sequence to act as a second sequence; and
    (b) said second circuitry indicating when a signal propagating through said second sequence has passed through k of said cells of said second sequence.

12. A method of delaying a signal, comprising the steps of:
    (a) providing a calibration sequence of N delay cells, $C_1, C_2 \ldots C_N$;
    (b) providing a second sequence of N delay cells, $S_1, S_2 \ldots S_N$, each of said cells of said second sequence providing a delay equal to about $\lambda$ times the delay of a corresponding cell of said calibration sequence, where $\lambda$ is any number greater than zero;
    (c) inputting a first transition signal into cell $C_1$ of said calibration sequence;
    (d) then, at a fixed time after said inputting, coupling an output of $C_j$ of said cells of said calibration sequence to an output of $S_i$ of said cells of said sequence for $1 \leq i \leq N$;

(e) inputting an input signal into cell $S_1$ of said second sequence; and (f) then outputting a delayed signal when the outputs of said N delay cells of said second sequence from said input signal correspond to said outputs of said N delay cells of said calibration sequence.

13. A delay line comprising:

(a) a calibration sequence of delay cells;

(b) a second sequence of delay cells with the delay of each of said cells of said second sequence equal to about $\lambda$ times the delay of the corresponding cell of said calibration sequence, where $\lambda$ is any number greater than zero;

(c) latch circuitry which stores information of the outputs of a plurality of cells of said calibration sequence; and (d) logic circuitry with inputs from said latch circuitry and from outputs of cells of said second sequence and with an output indicating when the outputs of cells of said second sequence correlate to said stored outputs of cells of said calibration sequence;

(e) wherein one of said cells of said calibration sequence provides a delay suffering from that provided by a second of said cells of said calibration sequence.

14. A delay line, comprising:

(a) a calibration sequence of delay cells;

(b) a second sequence of delay cells with the delay of each of said cells of said second sequence equal to about $\lambda$ times the delay of the corresponding cell of said calibration sequence, where $\lambda$ is a number greater than zero;

(c) latch circuitry which stores information of the outputs of a plurality of cells of said calibration sequence;

(d) logic circuitry with inputs both from said latch circuitry and from outputs of cells of said second sequence and with an output indicating when the outputs of cells of said second sequence correlate to said stored outputs of cells of said calibration sequence; and (e) said latch circuitry includes XOR gates with the inputs of each of said XOR gates coupled to the latched output and the output of one of said cells of said calibration sequence.

* * * * *